United States Patent [19]

Jean

[11] Patent Number: 5,343,940

[45] Date of Patent: Sep. 6, 1994

[54] FLEXIBLE HEAT TRANSFER DEVICE

[76] Inventor: Amigo Jean, No. 18, Alley S, Lane 19, Nu-Chung Rd., I-Lan City, Taiwan

[21] Appl. No.: 146,432

[22] Filed: Oct. 29, 1993

Related U.S. Application Data

[63] Continuation of Ser. No. 969,785, Oct. 29, 1992, abandoned.

[51] Int. Cl.$^5$ .................. H01L 23/427; F28D 15/02
[52] U.S. Cl. .................. 165/104.33; 165/46; 165/80.4; 361/700; 257/715
[58] Field of Search .................. 165/46, 104.33, 80.4; 361/700; 257/715

[56] References Cited

U.S. PATENT DOCUMENTS

| | | | |
|---|---|---|---|
| 3,256,703 | 6/1966 | Selwitz | 165/46 |
| 4,279,294 | 7/1981 | Fitzpatrick | 165/46 |
| 4,449,576 | 5/1984 | Baum et al. | 361/700 |
| 4,513,346 | 4/1985 | Devins | 361/700 |
| 4,697,427 | 10/1987 | Niggeman et al. | 361/700 |
| 4,793,405 | 12/1988 | Diggelmann et al. | 361/700 |

FOREIGN PATENT DOCUMENTS 646183 2/1979 U.S.S.R. .................. 165/46

OTHER PUBLICATIONS

Hultmark et al., EB *Thermal Enhancement of Modules* IBM Technical Disclosure Bulletin vol. 19, No. 8, Jan. 1977 p. 3127.

*Primary Examiner*—Albert W. Davis, Jr.
*Attorney, Agent, or Firm*—Baker & Botts

[57] ABSTRACT

A flexible heat transfer device includes a closed flexible envelopment which is made of a plastic film and which has a receiving space provided therein. The envelopment has a first section and a second section spaced from the first section. The receiving space of the envelopment contains a heat transfer liquid which has a boiling point between a temperature of a heat source and an ambient temperature. Therefore, the heat transfer liquid in the first section of the envelopment is evaporated into a vapor when the first section of the envelopment contacts the heat source, and the vapor is condensed in the second section of the envelopment at the ambient temperature.

1 Claim, 2 Drawing Sheets

FLEXIBLE HEAT TRANSFER DEVICE

CROSS REFERENCE TO RELATED APPLICATIONS

This application is a continuation of application Ser. No. 07/969,785 filed Oct. 29, 1992, entitled "Flexible Heat Transfer Device" by Amigo Jean, now abandoned.

BACKGROUND OF THE INVENTION

1. Field of the Invention

This invention relates to a heat transfer device, more particularly to a flexible heat transfer device.

2. Description of the Related Art

Various types of heat transfer devices for dissipating heat are available. A typical heat transfer device is the heat pipe which has the best cooling ability and reliability, the lowest noise and the most compact volume when compared to the other types of heat transfer devices, such as water cooling heat exchangers, natural convection coolers, force convection coolers, etc. However, because the heat pipes are made of copper, aluminum or stainless steel rigid tubes with a circular cross section, they must be inserted into the heat source or provided with a carrier which serves as an auxiliary contact means between the heat pipes and the heat source in order to increase the effective contact area for heat dissipation. The carrier reduces the heat dissipation efficiency of the heat pipe. FIG. 1 is a perspective schematic view illustrating the heat dissipation of a circuit member by utilizing a heat pipe. The power IC 31 contacts the heat pipe 235 by means of a carrier 33 with a curved contact face. A plurality of heat dissipation plates 37 are provided on the heat pipe 37 in order to achieve the heat dissipation process. Therefore, although the heat pipe 35 has an excellent heat dissipation effect, the heat resistant of the carrier 33 and the complicated design greatly reduce the utility of the heat pipe in practice. The limited contact areas of the heat pipes and the heat sources, and the rigidity of the heat pipes cause the heat dissipation design work to be difficult if heat pipes are to be used. FIG. 2 is a schematic view of another embodiment of the heat pipes. In this embodiment, the heat from the printed circuit boards 41 and 42 is transferred to a heat dissipation plate 45 by means of specially designed bent heat pipes, 43 and 44. In addition, if the heat source is an electronic element, the metal heat tubes must be insulated. This increases the complexity and manufacturing cost of the heat pipes. Therefore, the heat pipes are often used in high precision or high technology equipments. The heat pipes are rarely used in ordinary industry equipments.

SUMMARY OF THE INVENTION

It is therefore an object of this invention to provide a flexible heat transfer device which has large contact surface for heat dissipation without the need for an auxiliary contact means.

It is another object of this invention to provide a flexible heat transfer device which can be easily arranged for heat dissipation design work.

It is still another object of this invention to provide a flexible heat transfer device which is insulative when applied to an electronic heat source.

Accordingly, the flexible heat transfer device of this invention includes a closed flexible envelopment which is made of a plastic film and which has a receiving space provided therein. The envelopment has a first section and a second section spaced from the first section. The receiving space of the envelopment contains a heat transfer liquid, which has a boiling point between a temperature of a heat source and an ambient temperature. Therefore, the heat transfer liquid in the first section of the envelopment is evaporated into a vapor, when the first section of the envelopment contacts the heat source, and the vapor is condensed in the second section of the envelopment at the ambient temperature.

Other features and advantages of this invention will become apparent in the following detailed description of the preferred embodiment of this invention with reference to the accompanying drawings.

DETAILED DESCRIPTION OF THE PREFERRED EMBODIMENT

Figure 1:
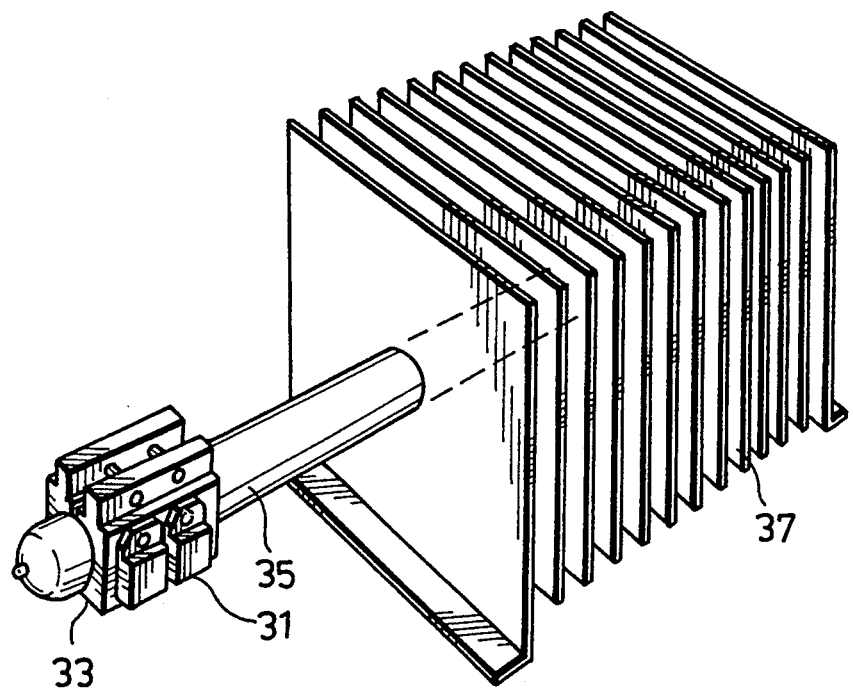
FIG. 1 is a perspective schematic view illustrating the heat dissipation of a circuit member by utilizing a heat pipe.
Figure 2:
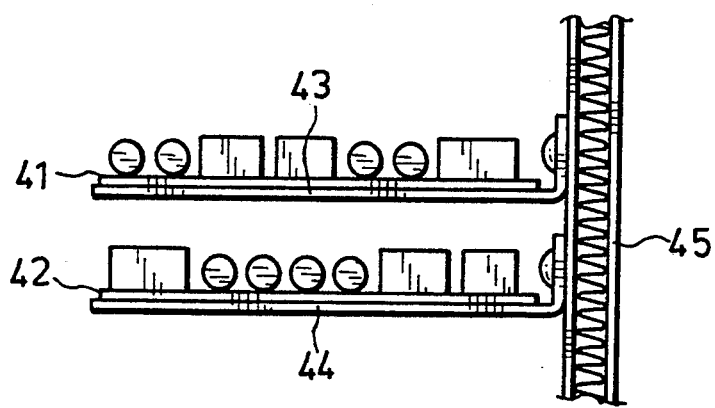
FIG. 2 is a schematic view illustrating another example of the heat pipes.
Figure 3:
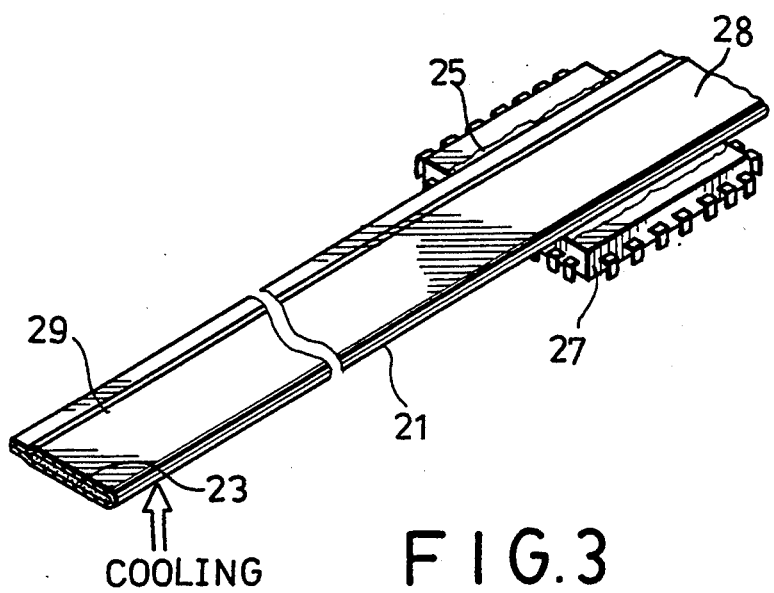
FIG. 3. is a fragmentary perspective view of a preferred embodiment of the flexible heat transfer device of this invention.

FIG. 3. is a fragmentary perspective view of a preferred embodiment of the flexible heat transfer device of this invention. The flexible heat transfer device includes a closed flexible envelopment 21 having a receiving space in which a heat transfer liquid 23 is received. The heat transfer liquid 23 is filled into the envelopment 21 at a given ratio at an ambient temperature and at the atmospheric pressure. The given ratio is determined by the power of the heat source and the vapor pressure of the heat transfer liquid.

Selection of the heat transfer liquid is important. It is normal that the boiling point of the heat transfer liquid is set to be lower than the temperature of a heat source and higher than an ambient temperature, in which the ambient serves as the cooling temperature. The envelopment 21 may be firmly attached to the surface of the heat source 27 by means of a known thermal bond 25. The heat from the heat source 27 will be transferred to a first section 28 of the envelopment 21, which contacts the heat source, through the extremely thin thermal bond 25 with a high heat conductivity by means of a heat conductive process. The envelopment 21 is in the form of a strip of flat tube and is made of a thin film which is made of a plastic material or a laminated plastic material. Because the thickness of the envelopment 21 is much thinner than that of the heat tube of the prior art, the heat transfer efficiency of the envelopment 21 of this invention is as high as that of the heat pipe although the heat conductivity of the plastic material of the envelopment 21 is lower than that of the metal heat pipe.

After the heat from the heat source 27 is transferred to the first section 28 of the envelopment 21, the heat transfer liquid in the first section 28 of the envelopment 21 will absorb the heat and evaporate into vapor because the temperature of the heat source is higher than the boiling point of the heat transfer liquid 23. The vapor will be quickly delivered away from the first section 28 by convection flow. The vapor will be cooled and condensed when it passes through a second section 29 which is spaced from the first section 28 which is at a lower temperature, that is, the ambient temperature. The condensed heat transfer liquid 23 will flow back to the first section 28 by means of gravity and capillarity of the envelopment 21. The heat transfer liquid 23 is thus evaporated and condensed in a cycle.

It is important to select a proper heat transfer liquid 23. The relationship between evaporating heat, the boiling point of the heat transfer liquid, the ambient temperature and the temperature of the heat source will be mainly considered. The surface tension, density, viscosity of the heat transfer liquid are also considered when selecting a proper heat transfer liquid. Assuming that the ambient temperature is 30° C. and the maximum temperature of the heat source is 90° C., and that the required operating temperature of the heat source is lower than 50° C., the proper heat transfer liquid is a liquid having a boiling point of 35° to 45° C. If the power of the heat source is large, the temperature of the heat source can be reduced by providing a plurality of envelopments to contact with the surface of the heat source and by providing a highly efficient cooling device, such as force convection coolers, water cooling heat exchangers, etc., at the second section in order to accelerate condensation of the vapor of heat transfer liquid. A liquid having a low boiling point (above the ambient temperature) and high evaporating heat can be used as the heat transfer liquid, such as ammonia, hydrocholorflorocarbon (HCFC), acetone, and ethanol.

The envelopment 21 of the flexible heat transfer device is made of a plastic film which can withstand the vapor pressure of the heat transfer liquid. For example, a heat transfer liquid of HCFC-141b/HCFC-123/methanol composition having a vapor pressure of 0.893 Kg/cm$^2$ at the temperature of 25° C. can be received in an envelopment made of a laminated plastic film material selected from PET/PE/AL/PE(CPP), OPP/PVA/PE and PET/AL/RCPP, which have good strength and insulation.

Figure 4:
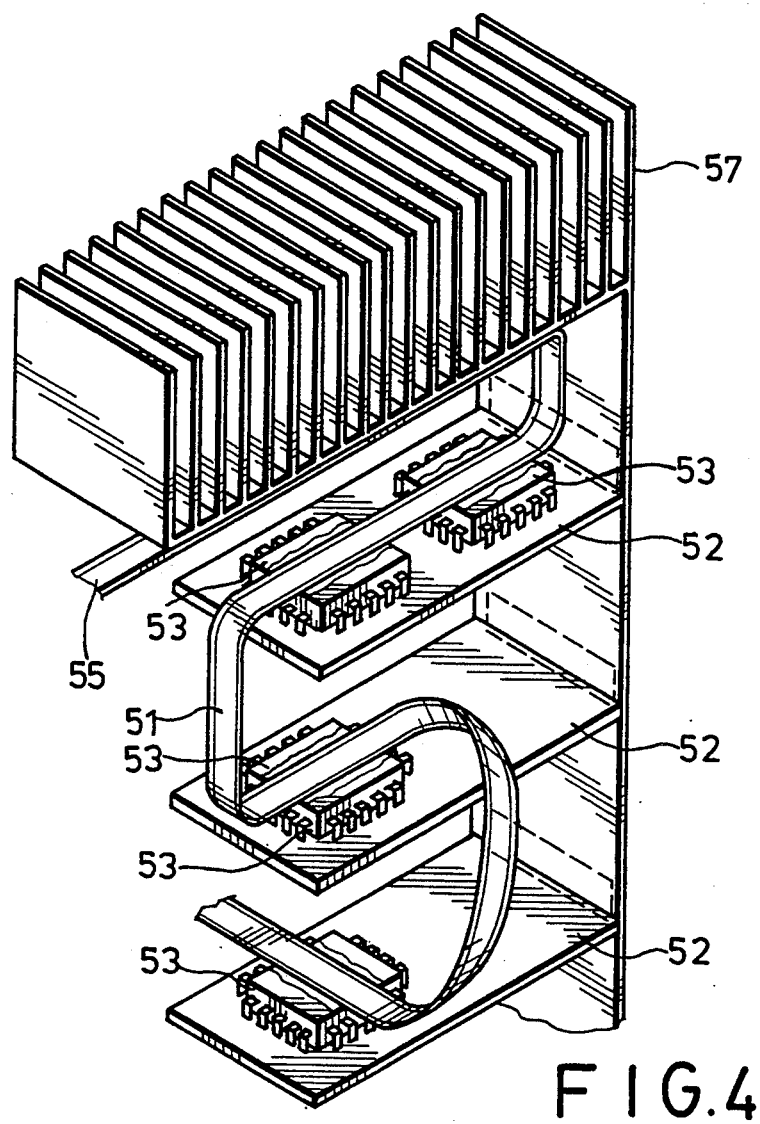
FIG. 4 is a perspective schematic view illustrating the heat dissipation of a circuit member by utilizing the flexible heat transfer device of this invention.

FIG. 4 is a perspective schematic view illustrating the heat dissipation of the electronic elements 53 on the circuit boards 52 by utilizing the envelopment 51 of the flexible heat transfer device of this invention. The envelopment 51 can be bent according to the arrangement of the electronic elements 53 of the circuit boards 52 in order to firmly contact the surfaces of the electronic elements 53 for heat dissipation purposes. The heat from the electronic elements 53 is transferred to the cooling section 55, which is connected with a plurality of heat dissipation plates 57. Therefore, the heat produced from the electronic elements 53, i.e. the heat source, can be dissipated by a phase change of the heat transfer liquid in the envelopment 51 as described hereinbefore.

It is found that the flexible heat transfer device of the present invention has the following advantages: (1) The flexibility of the envelopment increases the utility of the flexible heat transfer device.

(2) The flexible transfer device can be easily manufactured without any special conditions.

(3) The flexible heat transfer device is insulative. Therefore, it can be applied to an electronic apparatus.

(4) A large amount of latent heat is absorbed by phase change for heat dissipation.

(5) Evaporated vapor quickly flows to a cooling section during the phase change process.

(6) The condensed liquid flows back to the heated section of the envelopment by means of gravity and capillarity. Therefore, cooling reliability is relatively high.

(7) The heated section and the cooling section of the envelopment may be spaced away from each other.

(8) The envelopment can firmly contact the surface of the heat source by means of a thermal bond.

With this invention thus explained, it is apparent that numerous modifications and variations can be made without departing from the scope and spirit of this invention. It is therefore intended that this invention be limited only as indicated in the appended claims.

I claim:

1. A flexible heat transfer device for dissipating heat from first and second electronic elements respectively mounted to first and second circuit boards disposed in a casing, the first circuit board disposed parallel to and below the second circuit board, the device comprising:

a plurality of heat dissipation plates disposed on an exterior portion of the casing above the first and second circuit boards;

a flexible envelopment defining a receiving space, the flexible envelopment formed as a flat tubular strip of plastic film comprising, a lower section attached to the first electronic element and defining a lower portion of the receiving space, an intermediate section attached to the second electronic element and defining an intermediate portion of the receiving space, and an upper section attached to the dissipation plates and defining an upper portion of the receiving space;

a heat transfer fluid disposed within the receiving space and having a boiling point between an ambient temperature outside the casing and a desired temperature of the first and second electronic elements when active;

wherein the heat from the first and second elements respectively conducts through the lower and intermediate sections of the envelopment into the lower and intermediate portions of the receiving space and converts the fluid into a vapor;

wherein the vapor flows to and condenses in the upper portion of the receiving space, thereby transferring the heat through the upper section of the envelopment to the heat dissipation plates;

wherein the condensed vapor flows back to the intermediate and lower portions of the receiving space; and whereby a reciprocal flow of the heat transfer liquid is formed between the upper portion and the intermediate and lower portions of the receiving space and the heat is transferred via the heat transfer fluid to the heat dissipation plates.

* * * * *